United States Patent
Fahland et al.

(10) Patent No.: US 8,535,810 B2
(45) Date of Patent: Sep. 17, 2013

(54) TRANSPARENT PLASTIC FILM FOR SHIELDING ELECTROMAGNETIC WAVES AND METHOD FOR PRODUCING A PLASTIC FILM OF THIS TYPE

(75) Inventors: Matthias Fahland, Dresden (DE); Tobias Vogt, Zittau (DE); Nicolas Schiller, Stolpen OT Helmsdorf (DE); Waldemar Schoenberger, Dresden (DE); Steffen Guenther, Dresden (DE); John Fahlteich, Dresden (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 452 days.

(21) Appl. No.: 12/809,435

(22) PCT Filed: Oct. 16, 2008

(86) PCT No.: PCT/EP2008/008779
§ 371 (c)(1), (2), (4) Date: Jun. 18, 2010

(87) PCT Pub. No.: WO2009/080139
PCT Pub. Date: Jul. 2, 2009

(65) Prior Publication Data
US 2010/0307812 A1      Dec. 9, 2010

(30) Foreign Application Priority Data
Dec. 20, 2007   (DE) .................. 10 2007 061 419

(51) Int. Cl.
*H05K 9/00*     (2006.01)
*C23C 14/34*    (2006.01)
*C23C 14/35*    (2006.01)

(52) U.S. Cl.
USPC ...... 428/469; 204/192.15; 174/389; 428/701; 428/702

(58) Field of Classification Search
None
See application file for complete search history.

(56) References Cited

U.S. PATENT DOCUMENTS

| | | | |
|---|---|---|---|
| 4,450,201 A | 5/1984 | Brill et al. | |
| 5,372,874 A * | 12/1994 | Dickey et al. | 428/216 |
| 2002/0064662 A1 | 5/2002 | Lingle et al. | |
| 2003/0194567 A1 | 10/2003 | Lingle et al. | |
| 2003/0194570 A1 | 10/2003 | Lingle et al. | |
| 2003/0198816 A1 | 10/2003 | Lingle et al. | |
| 2005/0211993 A1* | 9/2005 | Sano et al. | 257/79 |
| 2007/0009703 A1* | 1/2007 | Shinkai et al. | 428/64.4 |
| 2007/0170050 A1 | 7/2007 | Charton et al. | |

(Continued)

FOREIGN PATENT DOCUMENTS

| | | |
|---|---|---|
| DE | 195 33 053 | 4/1997 |
| DE | 199 11 304 | 9/2000 |

(Continued)

OTHER PUBLICATIONS

Sikula et al. A VX Corporation, 2003.*

(Continued)

*Primary Examiner* — Vera Katz
(74) *Attorney, Agent, or Firm* — Greenblum & Bernstein, P.L.C.

(57) ABSTRACT

A transparent plastic film for screening electromagnetic waves includes a transparent film substrate and a layer system comprising at least one silver layer and two niobium oxide layers. The silver layer is embedded between the two niobium oxide layers.

21 Claims, 3 Drawing Sheets

(56) References Cited

U.S. PATENT DOCUMENTS

2008/0057264 A1    3/2008  Morimoto et al.
2009/0103247 A1*   4/2009  Karnik .................. 361/529
2010/0136331 A1    6/2010  Fahland et al.

FOREIGN PATENT DOCUMENTS

| EP | 0761618   | * | 3/1997  |
|----|-----------|---|---------|
| EP | 1 174 397 |   | 1/2002  |
| EP | 1 860 930 |   | 11/2007 |
| TW | 200715333 |   | 4/2007  |

OTHER PUBLICATIONS

Chinese Office action that issued with respect to patent family member Chinese Patent Application No. 200880122515.1, dated Aug. 1, 2011 (along with a partial English-language translation thereof).

Fahland M et al., "Optical properties of metal based transparent electrodes on polymer films", Thin Solid Films, Elsevier-Sequoia S.A. Lausanne, CH, XP022688392, ISSN: 0040-6090, available on line Oct. 16, 2007 at www.sciencedirect.com, Thin Solid Film (2008), , pp. 5777-5780.

* cited by examiner

TRANSPARENT PLASTIC FILM FOR SHIELDING ELECTROMAGNETIC WAVES AND METHOD FOR PRODUCING A PLASTIC FILM OF THIS TYPE

CROSS REFERENCE TO RELATED APPLICATIONS

The present application is a U.S. National Stage of International Application No. PCT/EP2008/008779 filed Oct. 16, 2008, which published as WO 2009/080139 A1 on Jul. 2, 2009, the disclosure of which is expressly incorporated by reference herein in its entirety. Further, this application claims priority under 35 U.S.C. §119 and §365 of German Application No. 10 2007 061 419.7 filed Dec. 20, 2007.

BACKGROUND OF THE INVENTION

1. Field of the Invention

The invention relates to a transparent plastic film, which is suitable for screening (shielding) electromagnetic waves, and a method by which a transparent plastic film of this type can be produced.

2. Background Description

Devices and systems from the field of modern technologies such as, for example, mobile radio telephone service, satellite television, microwave technology or radar technology are sources of electromagnetic fields. Other electrical devices as well as biological systems (human beings, animals and plants) are exposed to these fields, whereby their ability to function or their quality of life can be negatively impacted.

It is known that electrical devices can be protected with respect to the impact of electromagnetic radiation, and vice versa, that the electromagnetic radiated interference emitted by electrical devices can be suppressed.

The prior art therefore discloses various devices for screening electromagnetic waves, by which either the radiation of electromagnetic fields can be decreased or the action of electromagnetic fields produced by other devices can be reduced.

The protection from electromagnetic fields is based essentially on two physical principles. On the one hand it is possible to absorb electromagnetic fields by dielectric materials. On the other hand, however, it is also possible to reflect electromagnetic waves by electrically conducting materials.

The methodology of coating housing parts with electrically conducting layers, composed of metals that conduct electric current very well, such as, for example, copper or aluminum, is widespread. Another methodology lies in the use of composite materials that contain electrically conducting constituents. Thus, for example, films are known that are coated with an electrically conducting material (DE 199 11 304 A1). When films coated in this manner are applied, for example, to the housing of an electrically operated device, electromagnetic waves that act on the device can be screened and the functional efficiency of the device can thus be maintained.

Many modern devices require transparent parts in order to ensure an optoelectronic function. Often a transparent part of this type is embodied as a display element or a screen, which serves as an information interface. For these cases of use the above-referenced widespread methods of electromagnetic screening cannot be applied because they are not transparent.

One possible alternative lies in the coating of a transparent component with a transparent and conductive layer, such as, for example, indium tin oxide. However, layers of this type often have only an unsatisfactory screening with respect to electromagnetic radiation. The reason for this is that the specific conductivity of transparent layers of this type is much lower compared to the above-mentioned metals. While the best layers of indium tin oxide reach a specific resistance of $1 \times 10^{-4}$ ohm cm, the value for copper is approximately $1.7 \times 10^{-6}$ ohm cm and that for aluminum is approximately $2.6 \times 10^{-6}$ ohm cm. The specific resistance of a transparent oxide is thus much greater. If a component to be coated is made of plastic and not of glass, the difference is even greater. In this case due to the temperatures with an upper limit during the coating operation only approximately $5 \times 10^{-4}$ ohm cm is achieved with the use of indium tin oxide.

An improvement with respect to the specific resistance is provided by so-called IMI (insulator-metal-insulator) layer systems. With these layer systems the electromagnetic screening is caused virtually exclusively by the thin metal layer, which is embedded between the two insulator layers. Silver or silver alloys, in some cases also gold, are mostly used as the metal.

An insulator layer from an IMI layer system can be composed of different materials. Indium oxide doped with 10% tin oxide (also referred to as ITO) is widespread. The use of materials such as tin oxide, zinc oxide or titanium oxide is also known. One of the difficulties in the use of IMI layer systems is the restricted spectral transmission range of these layer systems. Usually an attempt is made to coordinate the layer thicknesses and the layer properties of the individual layers with one another such that a high transmission is achieved in the visible spectral range, that is, in the wavelength range of the light between 380 nm and 780 nm. Typical IMI layer systems of the structure ITO/silver/ITO on PET film achieve a transmission of over 80% with the light wavelength of 550 nm (total transmission including the film). A typical value for the layer thickness of the ITO layer is thereby between 30 nm and 40 nm. The transmission value at the edges of the visible spectral range drops considerably, however. For example, the above-referenced typical ITO/silver/ITO layer system with the light wavelength of 400 nm shows a transmission of only 60%.

Another disadvantage of layer systems of this type is that over the course of time the silver diffuses into adjacent layers or even into a film substrate, whereby the transparency and thus the functionality of the layer system is negatively affected.

SUMMARY OF THE INVENTION

The invention is therefore based on the technical problem of creating a transparent plastic film comprising a layer system for screening electromagnetic waves and a method for producing a plastic film of this type, with which the disadvantages of the prior art are overcome. In particular, the plastic film should have a long-term stable high transparency in the entire visible spectral range and the layer system should have a high adhesive strength on the film substrate.

An aim of the present invention is achieved with a transparent plastic film for screening electromagnetic waves, comprising a transparent film substrate and a layer system that has at least one silver layer, characterized in that the silver layer is embedded between two niobium oxide layers.

In additional embodiments, the two niobium oxide layers are embodied on the side facing towards the silver layer in a substoichiometric manner.

With further embodiments, the two niobium oxide layers are embodied on the side facing away from the silver layer in a stoichiometric manner.

According to further aspects of the invention, the two niobium oxide layers are composed respectively of two partial layers, in which respectively the side of a partial layer facing towards the silver layer is embodied in a substoichiometric manner and the side facing away from the silver layer is embodied in a stoichiometric manner.

In additional embodiments, the stoichiometric region of a niobium oxide layer or niobium oxide partial layer is embodied as $Nb_2O_5$.

With further embodiments, the two niobium oxide layers have a gradient such that a transition is embodied from the substoichiometric layer region to the stoichiometric layer region.

According to further aspects of the invention, the transition is embodied in a continuous manner.

In additional embodiments, the transition is embodied in a stepwise manner.

With further embodiments, the silver layer is embodied with a thickness of 5 to 20 nm.

According to further aspects of the invention, the silver layer is embodied with a thickness of 8 nm to 15 nm.

In additional embodiments, the substoichiometric region of a niobium oxide layer or a niobium oxide partial layer embodied in a substoichiometric manner is embodied with a thickness of up to 5 nm.

With further embodiments, the substoichiometric region of a niobium oxide layer or a niobium oxide partial layer embodied in a substoichiometric manner is embodied with a thickness of 2 nm to 3 nm.

According to further aspects of the invention, the two niobium oxide layers are embodied with a thickness of up to 50 nm.

In additional embodiments, the two niobium oxide layers are embodied with a thickness of 30 to 50 nm.

With further embodiments, the silver layer and the niobium oxide layers are precipitated by sputtering.

An additional aim of the present invention is achieved with a method for producing a transparent plastic film suitable for screening electromagnetic waves, comprising a transparent film substrate and a layer system that has at least one silver layer, characterized in that the silver layer is precipitated between two niobium oxide layers.

According to further aspects of the invention, the two niobium oxide layers are embodied on the side facing towards the silver layer in a substoichiometric manner.

In additional embodiments, the two niobium oxide layers are embodied on the side facing away from the silver layer in a stoichiometric manner.

With further embodiments, the two niobium oxide layers are respectively precipitated in two partial layers, in which respectively the side of a partial layer facing towards the silver layer is embodied in a substoichiometric manner and the side facing away from the silver layer is embodied in a stoichiometric manner.

According to further aspects of the invention, the stoichiometric region of a niobium oxide layer or niobium oxide partial layer is embodied as $Nb_2O_5$.

In additional embodiments, the two niobium oxide layers are precipitated with a gradient such that a transition from the substoichiometric layer region to the stoichiometric layer region is embodied.

With further embodiments, the silver layer is embodied with a thickness of 5 nm to 20 nm.

According to further aspects of the invention, the silver layer is embodied with a thickness of 8 nm to 15 nm.

In additional embodiments, the substoichiometric region of a niobium oxide layer or a niobium oxide partial layer embodied in a substoichiometric manner is embodied with a thickness of up to 5 nm.

With further embodiments, the substoichiometric region of a niobium oxide layer or a niobium oxide partial layer embodied in a substoichiometric manner is embodied with a thickness of 2 nm to 3 nm.

According to further aspects of the invention, the two niobium oxide layers are embodied with a thickness of up to 50 nm.

In additional embodiments, the two niobium oxide layers are embodied with a thickness of 30 to 50 nm.

With further embodiments, the silver layer and the niobium oxide layers are precipitated by sputtering.

According to further aspects of the invention, a ceramic target is sputtered without the supply of oxygen by a magnetron for the precipitation of a substoichiometric layer region or a substoichiometric partial layer of a niobium oxide layer.

A transparent plastic film according to the invention for screening electromagnetic waves, comprising a transparent film substrate and a layer system that has at least one silver layer, as well as a method according to the invention for producing a plastic film of this type are characterized in that the silver layer is embedded between two niobium oxide layers. A silver layer for the purposes of the invention hereby is a layer the silver proportion of which is higher than 50%. A silver layer can therefore be a pure silver layer, a silver layer that has doping elements or also a silver alloy.

Two opposing aspects must be noted in the design of the silver layer thickness. For a high transparency it would be advantageous for the silver layer to be as thin as possible. The silver layer should therefore not be thicker than 20 nm. For a high electric conductivity of the silver layer and thus for good screening properties with respect to electromagnetic waves, however, a thick silver layer is advantageous. The silver layer should therefore not be thinner than 5 nm. A good compromise with respect to high transparency on the one hand and good electric conductivity on the other hand is achieved in a layer thickness range from 8 to 15 nm.

With respect to the transparency of the total layer system, the layer thickness of the niobium oxide layers is also limited. The niobium oxide layers should therefore not be thicker than 50 nm. Excellent properties with respect to transparency are achieved with the niobium oxide layers in a layer thickness range of 40 nm plus/minus 10 nm.

With the embedding of the silver layer between two niobium oxide layers, two further advantages could be observed. Thus, a niobium oxide layer has a high adhesive strength with respect to a plastic film as well as with respect to the silver layer, whereby a high strength of the layer system is achieved. Furthermore, a niobium oxide layer prevents the diffusion of particles from the silver layer. A long-term stable transparency of the layer system can be ensured thereby.

With one embodiment, the niobium oxide layers are embodied on the side facing towards the silver layer in a substoichiometric manner. The lack of oxygen in these substoichiometric regions of the niobium oxide layer restricts the oxidation of silver particles that adjoin the niobium oxide layers. The oxidation of silver particles, which can have a negative effect on the transparency as well as on the electric conductivity of the silver layer, is suppressed by the formation of substoichiometric niobium oxide layer regions.

With respect to the stoichiometry, a niobium oxide layer can therefore be embodied as a gradient layer so that the niobium oxide layer is embodied on the silver layer side in a substoichiometric manner and in a stoichiometric manner towards the other side. The transition from the substoichiometric region to the stoichiometric region can thereby be continuous or can also take place in steps. Alternatively, a niobium oxide layer can be composed of two partial layers, wherein adjoining the silver layer a substoichiometric niobium oxide partial layer can be precipitated and adjoining it a stoichiometric niobium oxide layer can be precipitated. The stoichiometric partial layer or the stoichiometric region of a niobium oxide layer can be embodied, for example, as $Nb_2O_5$. For the substoichiometric region of a niobium oxide layer or for the substoichiometric niobium oxide partial layer, layer thicknesses of up to 5 nm are suitable. Advantageously these layer thicknesses lie in a range of 2 to 3 nm.

Sputtering methods are suitable for the deposition of silver layer and niobium oxide layers in particular because the very thin substoichiometric niobium oxide layer regions or partial layers can also be precipitated precisely with very low layer thickness tolerances with these methods. Therefore, in a further embodiment a substoichiometric layer region or a substoichiometric partial layer of a niobium oxide layer is therefore precipitated, in that a ceramic target (for example, a substoichiometric niobium oxide target, in particular with the composition $Nb_2O_{4.9}$) is sputtered non-reactively, that is, without separate oxygen supply into the vacuum chamber, by a magnetron.

BRIEF DESCRIPTION OF THE DRAWINGS

The invention is explained in more detail below based on a preferred exemplary embodiment. The figures show.

DETAILED DESCRIPTION OF THE INVENTION

Figure 1:
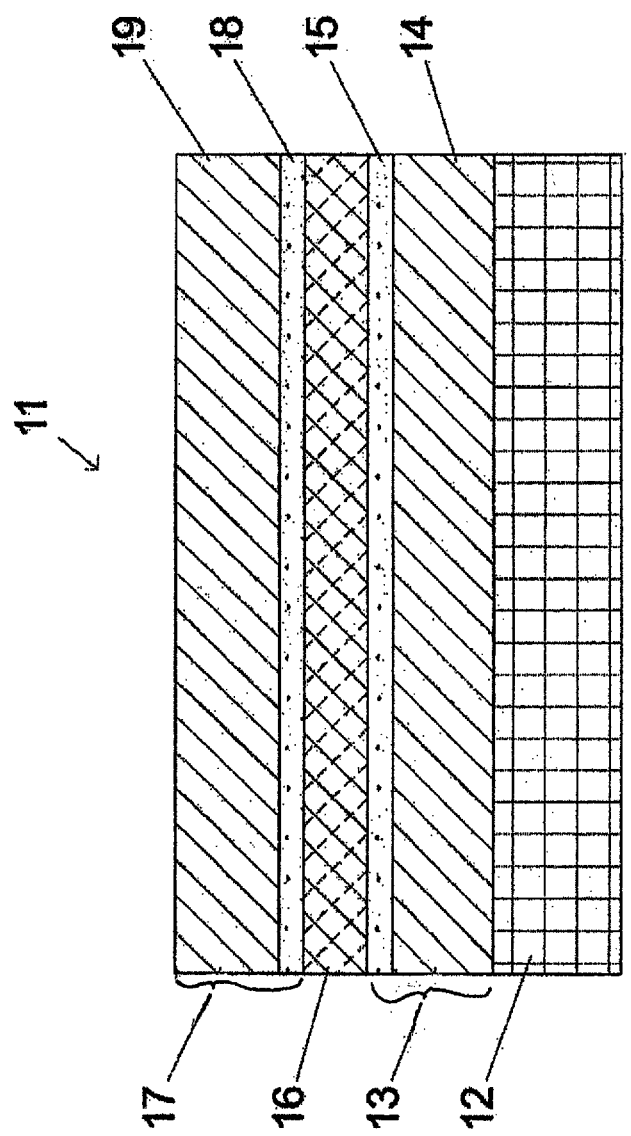
FIG. 1 A diagrammatic representation of a transparent plastic film according to the invention.

FIG. 1 shows diagrammatically a transparent plastic film 11 for screening electromagnetic waves. First a niobium oxide layer 13 was precipitated on a polyethylene terephthalate (PET) film substrate 12 that is 75 μm thick. The niobium oxide layer 13 is composed of two partial layers, a stoichiometric niobium oxide partial layer 14 of $Nb_2O_5$ 30 nm thick adjoining the film substrate 12 and a substoichiometric niobium oxide partial layer 15 of $Nb_2O_x$ (X<5) only 3 nm thick precipitated thereon. A silver layer 16 that is 12 nm thick is located on the niobium oxide layer 13, which silver layer is adjoined by a further niobium oxide layer 17. The niobium oxide layer 17 also has a substoichiometric niobium oxide partial layer 18 of $Nb_2O_x$ (X<5) only 3 nm thick and a stoichiometric niobium oxide partial layer 19 of $Nb_2O_5$ 30 nm thick precipitated thereon. All of the layers and partial layers were precipitated by a magnetron sputtering method.

Figure 2:
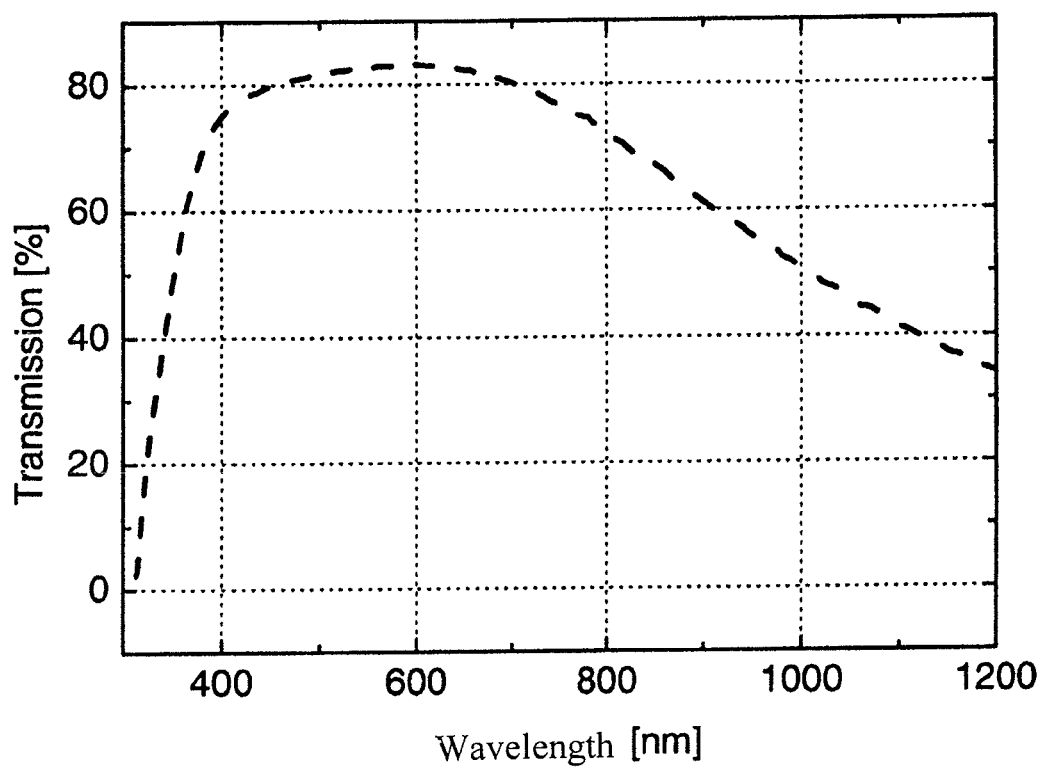
FIG. 2 A graphic representation of the transmission spectrum of the transparent plastic film according to the invention from FIG. 1.

The plastic film 11 is characterized by a high adhesive strength of the individual layers and partial layers and is characterized by a high transparency in the visible range. The transmission of the plastic film 11 is illustrated graphically in FIG. 2 over a wavelength range. It is discernible from FIG. 2 that the maximum transmission of the plastic film 11 achieved is substantially above 80%. Furthermore, it is discernible that a transmission above 70% can be maintained over the entire visible spectral range, that is, in the wavelength range from 380 nm to 780 nm. For comparison: the transmission of the uncoated PET film substrate 12 is 88% over the visible spectral range.

Figure 3:
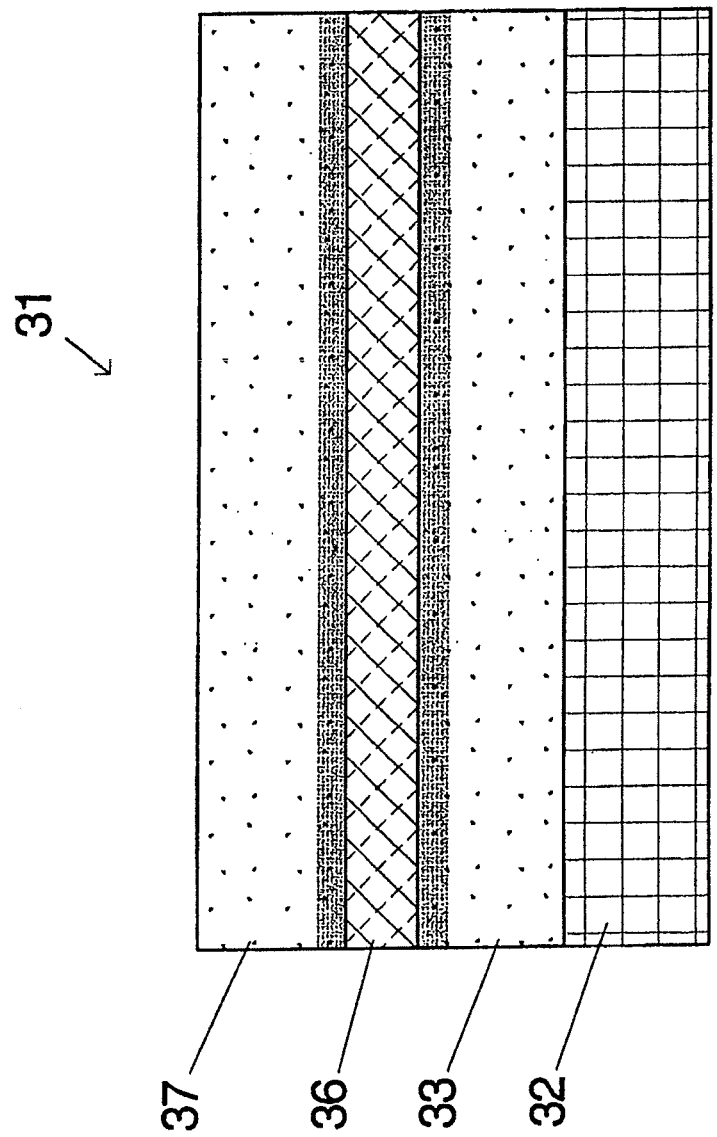
FIG. 3 A diagrammatic representation of an alternative transparent plastic film according to the invention.

FIG. 3 shows an alternative embodiment of a transparent plastic film 31 for screening electromagnetic waves. Plastic film 31 comprises a 75 μm thick film substrate 32 of PET and two niobium oxide layers 33 and 37 that are 40 nm thick, between which a silver layer 36 that is 12 nm thick is embedded. The niobium oxide layers 33 and 37 are embodied as gradient layers such that they are embodied on the side facing towards the silver layer 36 as a substoichiometric layer $Nb_2O_x$ (X<5) and on the side facing away from the silver layer 36 as a stoichiometric layer $Nb_2O_5$. The stoichiometry gradient thereby changes continuously within a layer thickness of 5 nm adjacent to the silver layer 36 from the substoichiometric to a completely stoichiometric composition. All of the layers were also hereby precipitated by a magnetron sputtering method.

The invention claimed is:

1. A transparent plastic film for screening electromagnetic waves, comprising:
    a transparent film substrate; and
    a layer system comprising at least one silver layer and two niobium oxide layers, wherein the at least one silver layer is embedded between the two niobium oxide layers,
    wherein the layer system and the substrate are arranged as an electromagnetic wave shield
    wherein the two niobium oxide layers are composed respectively of two partial layers, in which respectively a side of each partial layer facing towards the silver layer comprises a substoichiometric region embodied in a substoichiometric manner, and a side of each partial layer facing away from the silver layer comprises a stoichiometric region embodied in a stoichiometric manner, and
    wherein the two niobium oxide layers each comprise a gradient such that a transition is embodied from the substoichiometric region to the stoichiometric region.

2. The plastic film of claim 1, wherein the stoichiometric region of at least one of the two niobium oxide partial layers is embodied as $Nb_2O_5$.

3. The plastic film of claim 1, wherein the silver layer comprises a thickness of 5 to 20 nm.

4. The plastic film of claim 3, wherein the silver layer comprises a thickness of 8 nm to 15 nm.

5. The plastic film of claim 1, wherein the substoichiometric region comprises a thickness of up to 5 nm.

6. The plastic film of claim 5, wherein the substoichiometric region comprises a thickness of 2 nm to 3 nm.

7. The plastic film of claim 1, wherein the two niobium oxide layers each comprise a thickness of up to 50 nm.

8. The plastic film of claim 7, wherein the two niobium oxide layers each comprise a thickness of 30 to 50 nm.

9. The plastic film of claim 1, wherein the silver layer and the two niobium oxide layers are precipitated by sputtering.

10. A method for producing a transparent plastic film suitable for screening electromagnetic waves, comprising:
    forming a layer system having at least one silver layer and two niobium oxide layers on a transparent film substrate,
    wherein the at least one silver layer is precipitated to be embedded between the two niobium oxide layers,
    wherein the layer system and the substrate are arranged as an electromagnetic wave shield
    wherein the two niobium oxide layers are composed respectively of two partial layers, in which respectively a side of each partial layer facing towards the silver layer comprises a substoichiometric region embodied in a substoichiometric manner, and a side of each partial layer facing away from the silver layer comprises a stoichiometric region embodied in a stoichiometric manner, and wherein the two niobium oxide layers each comprise a gradient such that a transition is embodied from the substoichiometric region to the stoichiometric region.

11. The method of claim 10, further comprising precipitating the two niobium oxide layers, wherein the silver layer and the two niobium oxide layers are precipitated by sputtering.

12. The method of claim 10, wherein a precipitating of the substoichiometric region of each niobium oxide layer comprises magnetron sputtering a ceramic target in the absence of an oxygen supply.

13. The method of claim 10, wherein the stoichiometric region of at least one of the two niobium oxide partial layers comprises $Nb_2O_5$.

14. The method of claim 10, wherein the silver layer comprises a thickness of 5 nm to 20 nm.

15. The method of claim 14, wherein the silver layer comprises a thickness of 8 nm to 15 nm.

16. The method of claim 10, wherein the substoichiometric region of each niobium oxide partial layer comprises a thickness of up to 5 nm.

17. The method of claim 16, wherein the substoichiometric region of each niobium oxide partial layer comprises a thickness of 2 nm to 3 nm.

18. The method of claim 10, wherein the two niobium oxide layers each comprise a thickness of up to 50 nm.

19. The method of claim 18, wherein the two niobium oxide layers each comprise a thickness of 30 to 50 nm.

20. A transparent plastic film for screening electromagnetic waves, comprising:
a transparent film substrate; and
a layer system comprising at least one silver layer and two niobium oxide layers, wherein the at least one silver layer is embedded between the two niobium oxide layers,
wherein the two niobium oxide layers are composed respectively of two partial layers, in which respectively a side of each partial layer facing towards the silver layer comprises a substoichiometric region embodied in a substoichiometric manner, and a side of each partial layer facing away from the silver layer comprises a stoichiometric region embodied in a stoichiometric manner,
wherein the two niobium oxide layers each comprise a gradient such that a transition is embodied from the substoichiometric region to the stoichiometric region, and
wherein the transition comprises a continuous transition.

21. A transparent plastic film for screening electromagnetic waves, comprising:
a transparent film substrate; and
a layer system comprising at least one silver layer and two niobium oxide layers, wherein the at least one silver layer is embedded between the two niobium oxide layers,
wherein the two niobium oxide layers are composed respectively of two partial layers, in which respectively a side of each partial layer facing towards the silver layer comprises a substoichiometric region embodied in a substoichiometric manner, and a side of each partial layer facing away from the silver layer comprises a stoichiometric region embodied in a stoichiometric manner,
wherein the two niobium oxide layers each comprise a gradient such that a transition is embodied from the substoichiometric region to the stoichiometric region, and
wherein the transition comprises a stepwise transition.

* * * * *